(12) United States Patent
Dekkers et al.

(10) Patent No.: US 10,128,467 B2
(45) Date of Patent: Nov. 13, 2018

(54) METHOD FOR DEPOSITING A TARGET MATERIAL ONTO A ORGANIC ELECTRICALLY FUNCTIONAL MATERIAL

(71) Applicant: Solmates B.V., Enschede (NL)

(72) Inventors: Jan Matthijn Dekkers, Aadorp (NL); Jan Arnaud Janssens, Deventer (NL)

(73) Assignee: Solmates B.V., Enschede (NL)

( * ) Notice: Subject to any disclaimer, the term of this patent is extended or adjusted under 35 U.S.C. 154(b) by 0 days.

(21) Appl. No.: 14/434,938

(22) PCT Filed: Oct. 14, 2013

(86) PCT No.: PCT/EP2013/071429
§ 371 (c)(1),
(2) Date: Apr. 10, 2015

(87) PCT Pub. No.: WO2014/060356
PCT Pub. Date: Apr. 24, 2014

(65) Prior Publication Data
US 2015/0255757 A1   Sep. 10, 2015

(30) Foreign Application Priority Data
Oct. 17, 2012   (EP) ..................... 12188835

(51) Int. Cl.
*H01L 51/56* (2006.01)
*H01L 51/50* (2006.01)
(Continued)

(52) U.S. Cl.
CPC ............ *H01L 51/56* (2013.01); *C23C 14/024* (2013.01); *C23C 14/086* (2013.01); *C23C 14/28* (2013.01);
(Continued)

(58) Field of Classification Search
CPC . H01L 51/56; H01L 51/0021; H01L 51/5012; H01L 51/5206; H01L 51/5234;
(Continued)

(56) References Cited

U.S. PATENT DOCUMENTS

2002/0098668 A1* 7/2002 Kim .................. H01L 31/1884
                                                    438/584
2009/0058268 A1* 3/2009 Yoshida ................. B82Y 20/00
                                                    313/504
(Continued)

FOREIGN PATENT DOCUMENTS

EP        2159300 A1 * 3/2010 ............. C23C 14/28
WO    2009106828 A2    9/2009

OTHER PUBLICATIONS

Zheng, J.P., Kwok, H.S., "Low Resistivity Indium Tin Oxide Films by Pulsed Laser Deposition", 1993, Applied Physics Letters, 63, p. 1-3.*

(Continued)

*Primary Examiner* — Katherine A Bareford
*Assistant Examiner* — Christina D McClure
(74) *Attorney, Agent, or Firm* — The Webb Law Firm

(57) ABSTRACT

The invention relates to a method for depositing a target material onto an organic electrically functional material. The method includes the steps of: providing a substrate with an organic electrically functional material, like an emissive electroluminescent layer; creating a vapor plume of target material by pulsed laser deposition; depositing a first layer of target material on the organic electrically functional material, while maintaining the maximum particle velocity of the deposited particles below a preset value; and depositing a second layer of target material on the first layer of target material, while the maximum particle velocity of the deposited particles is above the preset value. The invention (Continued)

also relates to an intermediate product and to an organic light emitting diode.

5 Claims, 2 Drawing Sheets

(51) Int. Cl.
*H01L 51/00* (2006.01)
*H01L 51/52* (2006.01)
*C23C 14/02* (2006.01)
*C23C 14/08* (2006.01)
*C23C 14/28* (2006.01)
*C23C 14/34* (2006.01)

(52) U.S. Cl.
CPC ...... *C23C 14/3485* (2013.01); *C23C 14/3492* (2013.01); *H01L 51/0021* (2013.01); *H01L 51/5012* (2013.01); *H01L 51/5206* (2013.01); *H01L 51/5234* (2013.01); *H01L 2251/308* (2013.01); *H01L 2251/5369* (2013.01)

(58) Field of Classification Search
CPC ....... H01L 2251/308; H01L 2251/5369; C23C 14/024; C23C 14/086; C23C 14/28; C23C 14/3485; C23C 14/3492
USPC .......................................................... 427/596
See application file for complete search history.

(56) References Cited

U.S. PATENT DOCUMENTS

2011/0135848 A1  6/2011  Edwards et al.
2011/0236601 A1  9/2011  Janssens et al.

OTHER PUBLICATIONS

Man, B.Y., "Particle velocity, electron temperature, and density profiles of pulsed laser-induced plasmas in air at different ambient pressures", 1998, Applied Physics B, 67, p. 241-245.*

Boughaba et al: "Ultrathin TA2O5 films produced by large-area pulsed laser deposition", Thin Solid Films, Elsevier-Sequoia S.A. Lausanne, CH, vol. 371 Nos. 1-2, Aug. 1, 2000, pp. 119-125, XP004222529, ISSN: 0040-6090, DOI: 10.1016/S0040-6090(00)00982-2, figure 1.

Chung et al: "Improvement in performance of transparent organic light-emitting diodes with increasing sputtering power in the deposition of indium tin oxide cathode.", Applied Physics Letters, AIP, American Institute of Physics, Melville, NY, US, vol. 86, No. 9, Feb. 23, 2005, pp. 93504-095304, XPO12066559, ISSN; 0003-6951, DOI; 10.1063/1.1869534, the whole document.

Chung et al: "Radio frequency magnetron sputter-deposited indium tin oxide for use as a cathode in transparent organic light-emitting diode", Thin Solid Films, Elsevier-Sequoia S.A., Lausane, CH, vol. 491, No. 1-2, Nov. 22, 2005, pp. 294-297, XP027865849, ISSN: 0040-6090, the whole document.

Kim et al: "Indium tin oxide thin films grown on flexible plastic substrates by pulsed-laser deposition for organic light-emitting diodes", Applied Physics Letters, AIP, American Institute of Physics, Melville, NY, US, vol. 79, No. 3, Jul. 16, 2001, pp. 284-286, XP012029821, ISSN: 0003-6951, DOI: 10.1063/1.1383568, the whole document.

Kim et al: "Fabrication of organic light-emitting diodes using ITO anodes grown on polyethersulfone (PES) substrates by pulse-laser depositions", Proceedings of SPIE, vol. 5740, Apr. 10, 2005, pp. 145-148, XP055054239, ISSN: 0277-786X, DOI: 10.1117/12.590113, the whole document.

Meyer et al: "Indium-free transparent organic light emitting diodes with A1 doped Zn0 electrodes grown by atomic layer and pulsed laser deposition", Applied Physics Letters, AIP, American Institute of Physics, Melville, NY, US, vol. 93, No. 7, Aug. 22, 2008, pp. 73308-73308, XP012113590, ISSN: 0003-6951, DOI: 10.1063/1.2975176, the whole document.

Kowalsky et al: "See-through OLED displays", Proceeedings of the SPIE—The International Society for Optical Engineering SPIE—The International Society for Optical Engineering, USA, vol. 6486, Feb. 8, 2007, pp. 64860F-1, XP040236086, ISSN: 0277-786X cited in the application p. 12, paragraph Appendix A. Experimental.

Gorrn et al: "Towards see-through displays: Fully transparent thin-film transistors driving transparent organic light-emitting diodes", Advanced Materials, Wiley VCH Verlag, DE, vol. 18, No. 6, Mar. 17, 2006, pp. 738-741, XP009090863, ISSN: 0935-9648, DOI: 10.1002/ADMA.200501957, p. 741, paragraph Experimental.

Yamamoto et al: "Low-Damage Indium Tin Oxide Formation on Organic Layers Using Unique Cylindrical Sputtering Module and Application in Transparent Organic Light-Emitting Diodes", Japanese Journal of Applied Physics, The Japan Society of Applied Physics, Tokyo; JP, vol. 45, No. 4, Feb. 1, 2006, pp. L213-L216, XP001245531, ISSN: 0021-4922, DOI: 10.1143/JJAP.45.L213, figure 1.

Kim Han-Ki et al: "Plasma damage-free sputtering of indium tin oxide cathode layers for top-emitting organic light-emitting diodes", Applied Physics Letters, AIP, American Institute of Physics, Melville, NY, US, vol. 86, No. 18, Apr. 29, 2005, pp. 183503-183503, XP012065285, ISSN: 0003-6951, DOI: 10.1063/1.1923182, the whole document.

\* cited by examiner

METHOD FOR DEPOSITING A TARGET MATERIAL ONTO A ORGANIC ELECTRICALLY FUNCTIONAL MATERIAL

CROSS-REFERENCE TO RELATED APPLICATIONS

This application is the United States national phase of International Application No. PCT/EP2013/071429 filed Oct. 14, 2013, and claims priority to European Patent Application No. 12188835.8 filed Oct. 17, 2012, the disclosures of which are hereby incorporated in their entirety by reference.

BACKGROUND OF THE INVENTION

Field of the Invention

The invention relates to a method for depositing a target material onto an organic electrically functional material.

Description of Related Art

Depositing methods, and in particular physical vapor deposition methods, use a plume of vapor with particles, which are bombarded onto a substrate material. This plume of vapor is generated by exciting a target material, for instance using ions or photons, such that particles are freed from the target material. Due to the excitement, the particles gain kinetic energy, which moves the particles to the substrate and which energy is used for the particles to adhere to the substrate or even penetrate the substrate material. Depending on the substrate material and the obtained kinetic energy, the particles will penetrate to a certain depth of the substrate material and/or damage the material due to the bombardment.

In the field of organic light emitting diodes (OLEDs), efforts are made to provide transparent OLEDs. An OLED has typically a layered structure of a glass or transparent plastic layer, a first conducting layer, an emissive electroluminescent layer and a second conducting layer. By providing a voltage to the first and second conducting layer, the emissive electroluminescent layer is powered, such that it will emit light.

A transparent emissive electroluminescent layer is known, as well as transparent conducting layers. Typically a indium tin oxide layer is used for a transparent conducting layer, which is arranged on a substrate with a physical vapor deposition method. However, if a known physical vapor deposition method is used to deposit indium tin oxide, or a similar transparent conducting oxide, to the transparent emissive electroluminescent layer, the impact of the particles damages the emissive electroluminescent layer to the extent, that it no longer emits light when being powered, or its efficiency is strongly reduced due to a leakage current or short circuiting.

A common physical vapor deposition method used for creating OLEDs is sputtering deposition. Sputtering deposition uses the principle of exciting a target material by bombardment with ions or electrons. If the energy of these particles is high enough, the energy will release particles from the target material into a plasma. This plasma typically contains UV light, reactive ions and ozone. The ions and ozone will react with the emissive electroluminescent layer causing damage to the emissive electroluminescent layer. The UV light will generate a negative reaction on the emissive electroluminescent layer, destroying functional bonds.

Because the particles are only released from the target material when excited with a high enough energy, the released particles will have at least a minimum energy. This minimum energy of the particles already provides damage to the electroluminescent layer, in particular with the common target materials, such as indium tin oxide (ITO).

Furthermore, the density of the plasma generated by sputtering deposition is low as a result of the working principle of sputtering deposition. So, the particles may have the tendency of arriving on the emissive electroluminescent layer as distinct reactive ions without having contacted other particles and spread across a relatively considerable distance parallel to the surface of the emissive electroluminescent layer, still having a considerable kinetic energy when reaching the surface of the emissive electroluminescent layer. This high energy, apart from the reactivity of the particles, will cause damage to the emissive electroluminescent layer.

Kowalsky W. et al.: "See-through OLED displays", *Proc. SPIE* 6486, Light-Emitting Diodes: Research, Manufacturing, and Applications XI, 64860F (Feb. 13, 2007); doi: 10.1117/12.696402 describes that with the common sputtering techniques and pulsed laser deposition methods, efficient OLED's are not possible to manufacture. This publication describes that it is necessary to use a barrier layer between the emissive electroluminescent layer and the transparent conductive top electrode. Such a barrier layer is undesirable, since it reduces the transparency of the OLED. Thus, with the common physical vapor deposition methods such as sputtering deposition and pulsed laser deposition, efficient OLEDs are not possible to manufacture.

It is also known to use a silver deposition on the emissive electroluminescent layer. Silver has the advantage that it can be deposited under such conditions, that it will not damage the emissive electroluminescent layer. However, the transparency of a silver layer is also restricted. Typically, an OLED with a silver layer as one of the conductive layers can have a transparency of up to 40%.

Another disadvantage of the known methods, in particular laser deposition methods, is that they use ultraviolet light. Ultraviolet light damages the materials, which are typically used for OLED production. UV light in combination with the bombardment of particles is typically damaging for organic materials used for OLED production.

A possibility would be to arrange a protective layer of another material, which blocks ultraviolet light. However, such layers are often not transparent and in the case when an electrically conducting layer is to be arranged, the protective layer will isolate the electrically conducting layer from the emissive electroluminescent layer.

It is therefore an object of the invention to provide a method, in which the above mentioned disadvantages are reduced or even prevented.

SUMMARY OF THE INVENTION

This object is achieved with a method which comprises the steps of:
providing a substrate with an organic electrically functional material, like an emissive electroluminescent layer;
creating a vapor plume of target material by pulsed laser deposition;

depositing a first layer of target material on the organic electrically functional material, while maintaining the maximum particle velocity of the deposited particles below a preset value; and depositing a second layer of target material on the first layer of target material, while the maximum particle velocity of the deposited particles is above the preset value.

By organic electrically functional material an organic material is understood, which provides some function when powered, such as an organic emissive electroluminescent layer which will emit light when powered. Such organic electrically functional materials are typically damaged by known physical vapor deposition methods to such an extent, that the functionality of the material is lost or significantly reduced. With an organic emissive electroluminescent, this results in a reduced amount of produced light when powered or even complete failure.

With the method according to the invention, a first layer of target material is arranged on the organic electrically functional material without destroying the material. This is achieved by ensuring that the maximum particle velocity is maintained below a preset value. When the particle velocity, and thus the kinetic energy, of the particles is below a preset value, the particles will attach to the organic electrically functional material, but will not penetrate and/or damage the organic material, which could negatively affect the organic material.

By using pulsed laser deposition, the disadvantages of the prior art are overcome. Pulsed laser deposition uses photons instead of ions in order to excite the target material. As a result particles can be freed from the target material at a lower energy, such that the particles generally will have a lower kinetic energy compared to methods such as sputtering deposition.

Furthermore, in pulsed laser deposition, the created plasma plume is supersaturated, i.e. the particles are packed close to each other. Any ions created at the target, will have a larger probability to get in contact with each other in the supersaturated plasma and react to less harmful particles. This reduces the chance of damaging the organic electrically functional material.

When using pulsed laser deposition to deposit the target material, it is easier to control the maximum particle velocity while still maintaining an acceptable deposition rate compared to other physical vapor deposition methods.

Determination of the optimal process parameters is a process known to a person skilled in the art, but requires the understanding that each physical vapor deposition method may have its own optimal parameters and limitations. For example, when using sputtering deposition, it will typically not be possible to provide a plasma with particles having a kinetic energy, which does not cause damage to the organic electrically functional material.

In case a UV laser is used for creating the vapor plume, the first layer could also provide a UV protection for the organic electrically functional material, such that a higher UV intensity can be used during deposition of the second layer. In an embodiment of the invention the distance between the target material and the substrate is increased during depositing the first layer and said distance is decreased during depositing the second layer. This results in a lower maximum particle velocity on impact of the particles on the substrate and also a lower UV intensity on the substrate when the first layer is deposited.

Then the second layer is deposited on the first layer. The already deposited layer provides a protective layer for the organic electrically functional material, so the target material particles for the second layer can have a higher velocity during depositing than the target material particles used for the first layer.

With the method according to the invention, it is, because of the first layer, thus possible to deposit the target material in a conventional way on an organic electrically functional material, which would otherwise damage the organic material.

The preset value will have to be determined by experiment as the preset value will at least depend on the material of the target material, the physical vapor deposition method, the chosen deposition parameters and the organic electrically functional material. This will be within the common practice of the skilled person.

In a preferred embodiment of the method according to the invention the first layer is deposited while using a first pressure regime, the second layer is deposited while using a second pressure regime and the second pressure is lower than the first pressure.

With a physical depositing method a near vacuum environment is created in which the depositing is performed. By controlling the vacuum or the pressure in this environment, the impact velocity of the particles can be controlled. When a higher pressure regime is used, the particles of the target material in the vapor plume are slowed down more, such that the impact on the substrate is less violent and the sensitive material is no longer affected. With a higher pressure regime, the particles have a 'soft landing' on the organic electrically functional material.

As soon as the first layer is deposited with the target material, the pressure regime can be lowered, such that the particles can keep their speed and impact with full energy on the first layer, without damaging the underlying organic electrically functional material.

Although it would be most common to deposit the first and second layer with the same material, it will also be possible to change the target material before depositing the second layer. By using two different target materials, specific properties can be achieved for the layer deposited on the organic electrically functional material.

In a further preferred embodiment of the method according to the invention the vapor plume is moved over the surface of the organic electrically functional material and the vapor plume is controlled such, that the maximum velocity of the particles in the core of the plume is above the preset value and the maximum velocity of the particles around the core is below the preset value.

When a vapor plume is generated by exciting a target material with for example a laser beam, the vapor plume will have a core with a high concentration of particles having a high velocity. This core is surrounded with an envelope with a lower concentration of particles. The particles in the envelope will have a lower velocity.

By moving the vapor plume over the surface of the organic electrically functional material, the envelope with lower concentration of particles will deposit first on the organic electrically functional material. This provides the organic electrically functional material with the first layer of target material along the path of the plume. While the plume moves further, the core will pass over the material already deposited by the envelope of the plume. The particles within the core of the plume will then deposit the second layer of target material.

Preferably, the movement of the vapor plume starts outside of the surface of the organic electrically functional material. This ensures, that both the first layer and second layer of target material extend to the full surface of the organic electrically functional material.

When the vapor plume is moved over the surface of the organic electrically functional material it is necessary that the maximum velocity of the particles in the core of the plume is above the preset value and the maximum velocity of the particles around the core is below the preset value. Due to the way a vapor plume is generated, there is already a difference in particle velocity of the particles in the core and the particles enveloping the core. Choosing a suitable pressure regime, will ensure that the maximum particle velocity of the particles in the envelope is below the preset value, while the maximum velocity in the core is higher.

In a further embodiment of the method according to the invention, the combined first and second layer is a transparent conducting oxide, in particular indium tin oxide.

A transparent conducting oxide is a typical material, which could not be arranged on an organic electrically functional material, like an emissive electroluminescent layer, without the method according to the invention.

The invention also relates to an intermediate product manufactured with the method according to the invention, wherein the product comprises:
a substrate with an organic electrically functional material, like an emissive electroluminescent layer;
a first layer of target material deposited on the organic electrically functional material, wherein the deposited particles have marginally penetrated and/or damaged the organic electrically functional material.

With the intermediate product of the invention, a first layer of target material is arranged on the substrate with an organic electrically functional material. The deposited particles have marginally penetrated the organic material, such that the organic electrically functional material is not affected. The particles are arranged on the organic electrically functional material and have not, or only slightly, penetrated the organic electrically functional material.

The invention also relates to an organic light emitting diode comprising:
a substrate layer;
a first electric conducting layer arranged on the substrate layer;
an emissive electroluminescent layer arranged on the first electric conducting layer; and
a second electric conducting layer arranged on the emissive electroluminescent layer;
wherein the second electric conducting layer is arranged using the method according to the invention.

BRIEF DESCRIPTION OF THE DRAWINGS

These and other features of the invention will be elucidated in conjunction with the accompanying drawings.

DETAILED DESCRIPTION OF THE INVENTION

Figures 1A, 1B:
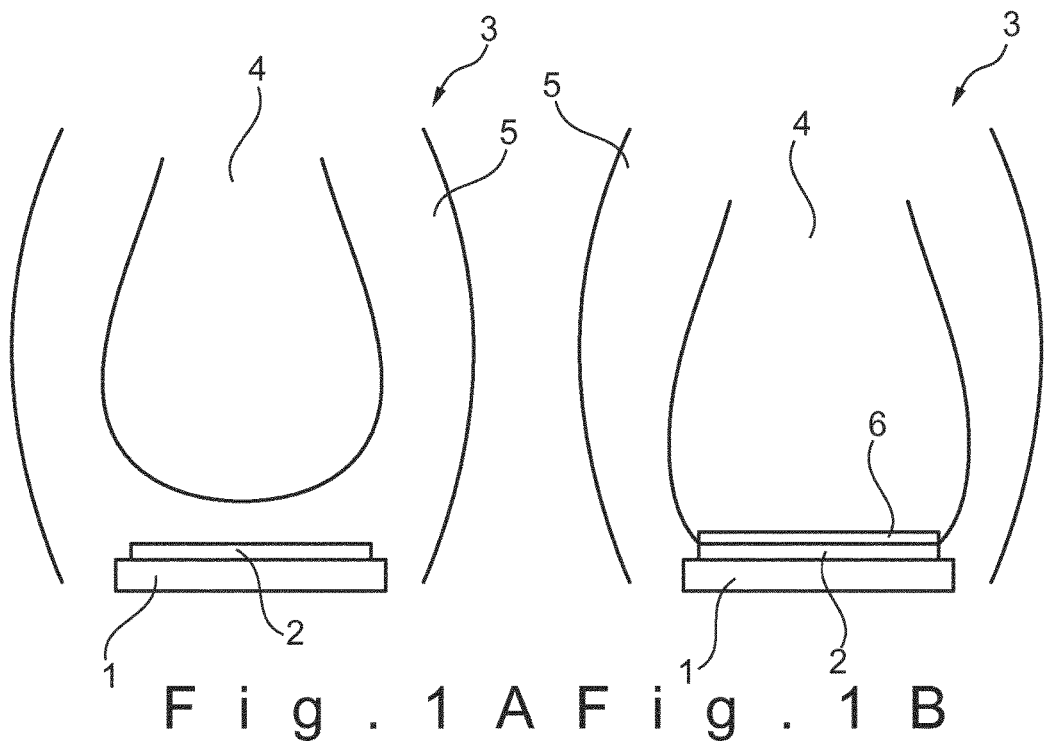
FIGS. 1A and 1B show two steps of a first embodiment according to the invention.

FIG. 1A shows a first step of a first embodiment of the method according to the invention. A substrate 1 is provided with a layer of organic electrically functional material 2. A vapor plume 3 with particles of a target material is generated with a pulsed laser deposition method. This vapor plume 3 has a core 4 and an envelope 5.

By controlling the pressure regime in which the vapor plume 3 is generated, the reach of the plume 3 and the impact of the particles within the plume 3 can be controlled. In the step shown in FIG. 1A, the pressure is relative high, such that the kinetic energy of the particles within the plume 3 is reduced and the particles have a 'soft landing' on the surface of the organic electrically functional material and form a first layer of target material 6.

In the step shown in FIG. 1B, the pressure is reduced, such that the particles within the plume 3 keep their kinetic energy and are deposited on top of the first layer of target material 6 in the conventional way to form the second layer of target material. Because the first layer 6 is already arranged on top of the organic electrically functional material 2, protecting this layer 2 and enabling conventional deposition of a second layer.

Figure 2:
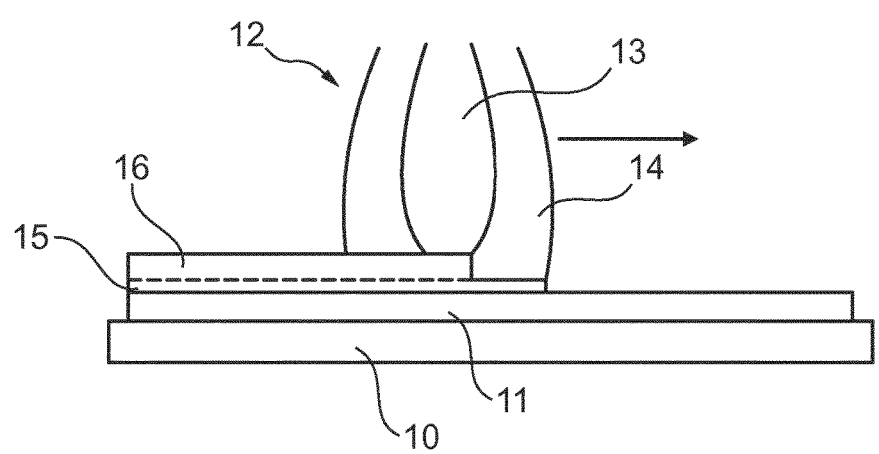
FIG. 2 shows a second embodiment of the method according to the invention.

FIG. 2 shows a second embodiment of the method according to the invention. A substrate 10 is provided with a layer 11 of a organic electrically functional material. Furthermore, a vapor plume 12 is generated. This vapor plume 12 has a core 13 with particles having a relatively high velocity, and an envelope 14 around the core 13 with particles with a relatively low velocity.

The plume 12 is moved over the surface of the organic electrically functional material 11. The envelope 14 deposits first a first layer 15 of target material of the organic material 11. The trailing core 13 then deposits a second layer 16 on the already deposited first layer 15. As the first layer 15 and second layer 16 are deposited with the same target material particles, a virtually homogeneous layer of target material on top of the organic material 11 is created.

Figure 3:
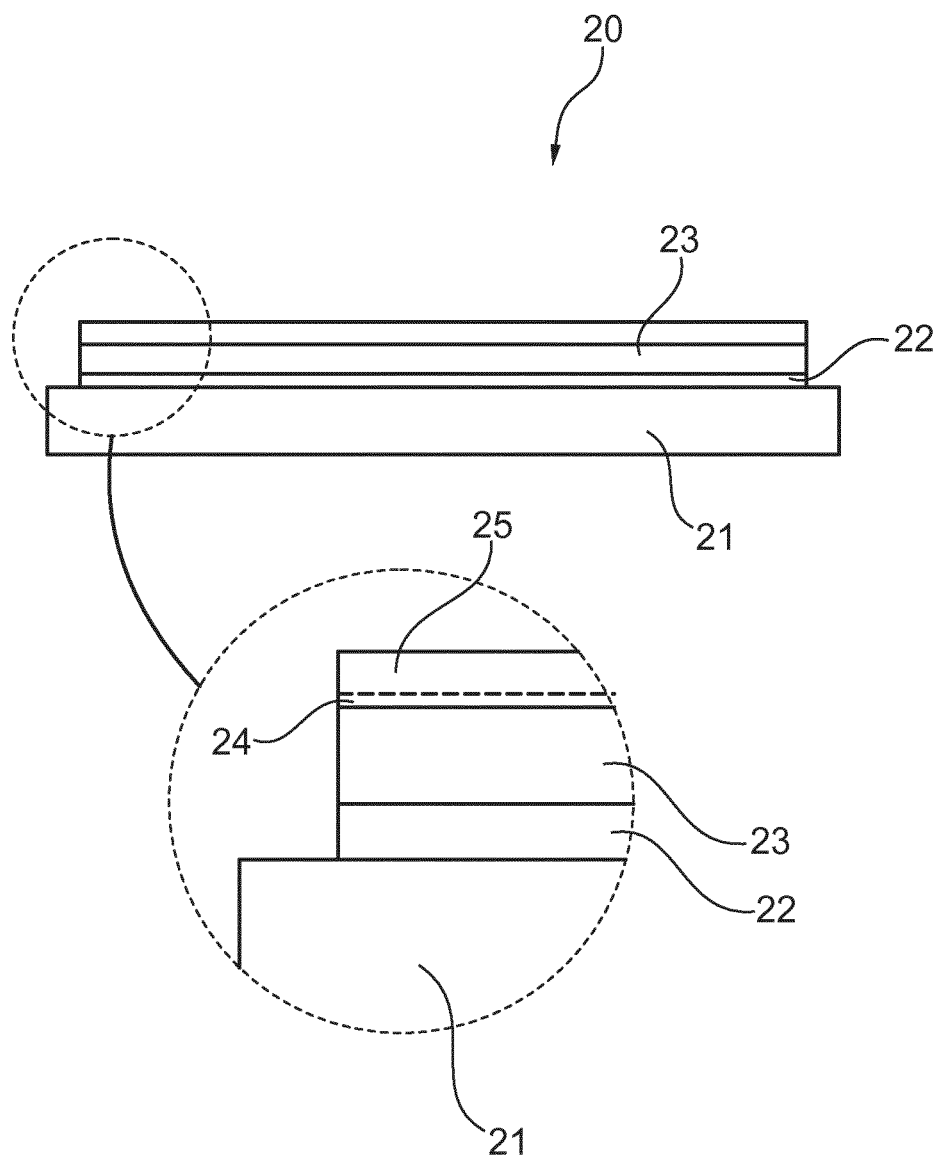
FIG. 3 shows a cross sectional view of an embodiment of the organic light emitting diode according to the invention.

FIG. 3 shows an embodiment 20 of an organic light emitting diode (OLED). This OLED 20 has a substrate layer 21, like a glass layer. A first conductive layer 22 is deposited with a conventional physical vapor deposition method on this substrate layer 21. Then an emissive electroluminescent layer 23 is provided on top of the conductive layer 22.

With the method according to the invention a second conductive layer 24, 25 is arranged on top of the sensitive, emissive electroluminescent layer 23. The first layer 24 of transparent conductive material is first deposited, after which the second layer 25 of transparent conductive material is deposited. Because both layers 24, 25 are subsequently deposited, a homogeneous layer is provide on the emissive electroluminescent layer 23.

When a voltage is applied to the two conductive layers 22 and 24, 25 the emissive electroluminescent layer 23 will emit light. As both conductive layers can be made transparent using for example indium tin oxide, a fully transparent OLED is obtained.

The invention claimed is:

1. A method for depositing a target material onto an organic electrically functional material, which method comprises the steps of:
(a) providing a substrate with an organic electrically functional material;
(b) creating a vapor plume of target material by pulsed laser deposition;
(c) depositing a first layer of target material on the organic electrically functional material from a first part of the vapor plume around the core of the plume, while controlling a first maximum particle velocity of the deposited particles within the first part of the vapor plume below a preset value, wherein the preset value is a particle velocity at which particles penetrate and/or damage the organic electrically functional material during deposition of the first layer of target material such that all particles deposited in the first layer of target material are deposited at a velocity below the preset value, and attach to the organic electrically functional material, but do not damage and/or penetrate the organic electrically functional material; and (d) depositing a second layer of target material on the first layer of target material from a second part of the vapor plume in the core of the plume, while controlling a second maximum particle velocity of the deposited particles within the second part of the vapor plume above the preset value such that at least some of the particles deposited in the second layer of target material are deposited at a velocity above the preset value, wherein the preset value is between the first and the second maximum particle velocities, and wherein the vapor plume is moved over the surface of the organic electrically functional material and the vapor plume is controlled such that the maximum velocity of the particles in the core of the plume is above the preset value and the maximum velocity of the particles around the core is below the preset value.

2. The method according to claim 1, wherein the movement of the vapor plume starts outside of the surface of the organic electrically functional material.

3. The method according to claim 1, wherein the combined first and second layer is a transparent conducting oxide.

4. The method according to claim 3, wherein the transparent conducting oxide comprises indium tin oxide.

5. The method according to claim 1, wherein the organic electrically functional material comprises an emissive electroluminescent layer.

* * * * *